United States Patent [19]

Grozinger et al.

[11] Patent Number: 5,250,801
[45] Date of Patent: Oct. 5, 1993

[54] OPTICAL SENSOR FOR DETECTING ARTICLES IN A MONITORED REGION AND METHOD FOR OPERATING THE SAME

[75] Inventors: Roland Grozinger, Staufen; Ottmar Kappeler, Nuremberg, both of Fed. Rep. of Germany; Herbert Krickl, Kyoto; Fritz Kuhn, Waldkirch, both of Japan

[73] Assignee: Erwin Sick GmbH Optik Elektronik, Waldkirch, Fed. Rep. of Germany

[21] Appl. No.: 867,239

[22] PCT Filed: Oct. 2, 1991

[86] PCT No.: PCT/EP91/01889
§ 371 Date: Jul. 2, 1992
§ 102(e) Date: Jul. 2, 1992

[87] PCT Pub. No.: WO92/06387
PCT Pub. Date: Apr. 16, 1992

[30] Foreign Application Priority Data

Oct. 2, 1990 [DE] Fed. Rep. of Germany ....... 4031142

[51] Int. Cl.⁵ .............................................. G01N 9/04
[52] U.S. Cl. ............................... 250/223 B; 250/222.1
[58] Field of Search ............ 250/222.1, 223 R, 223 B, 250/214 B; 340/555, 556, 557

[56] References Cited

U.S. PATENT DOCUMENTS 3,746,784  7/1973  Van Oostehovt ............... 250/223 B
4,590,410  5/1986  Jönsson .......................... 250/222.1

Primary Examiner—David C. Nelms
Assistant Examiner—K. Shami
Attorney, Agent, or Firm—Townsend and Townsend Khourie and Crew

[57] ABSTRACT

An optical sensor device for detecting reflecting objects (11) has a light pulse emitter (12) and a light receiver (13) connected to an evaluation circuit (14) having a pulse generator (17) and a reception signal processing stage (24) which only emits an object detection signal when the light pulses or light pulse sequences received by the light receiver (13) lie above a switching threshold. The evaluation circuit (14) has a pulse emission influencing and triggering stage (15) connected in parallel to the reception signal processing stage (24) which triggers the emission of the following light pulse by the pulse generator (17) only when a detected variable disturbing signal has disappeared.

19 Claims, 7 Drawing Sheets

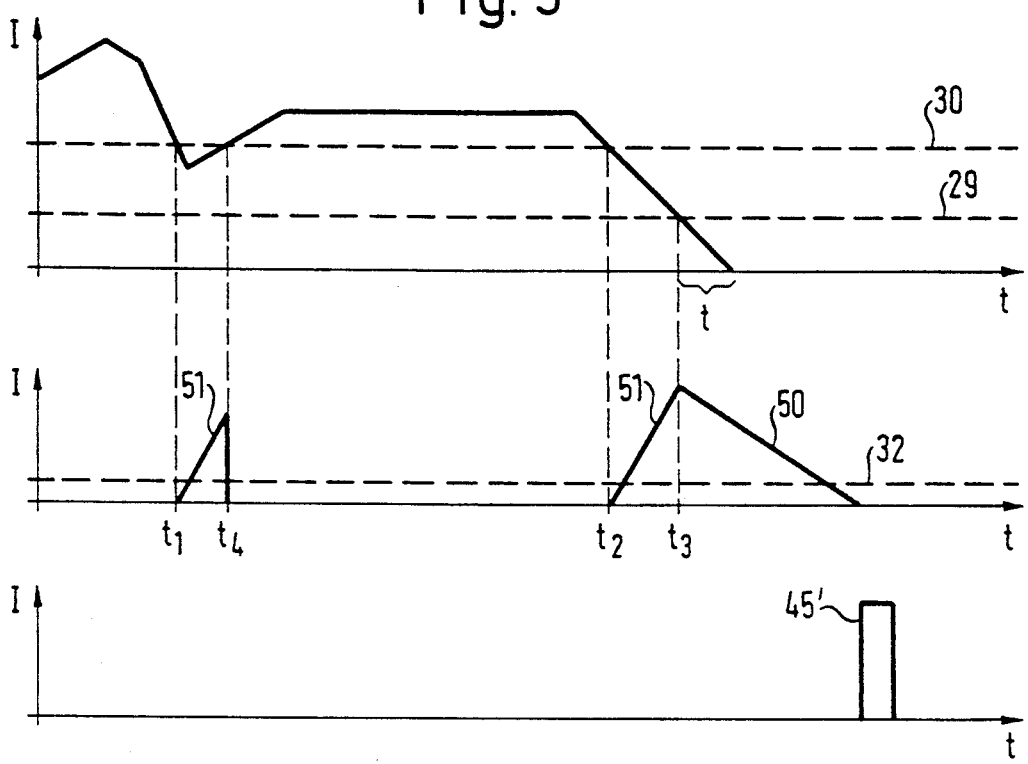
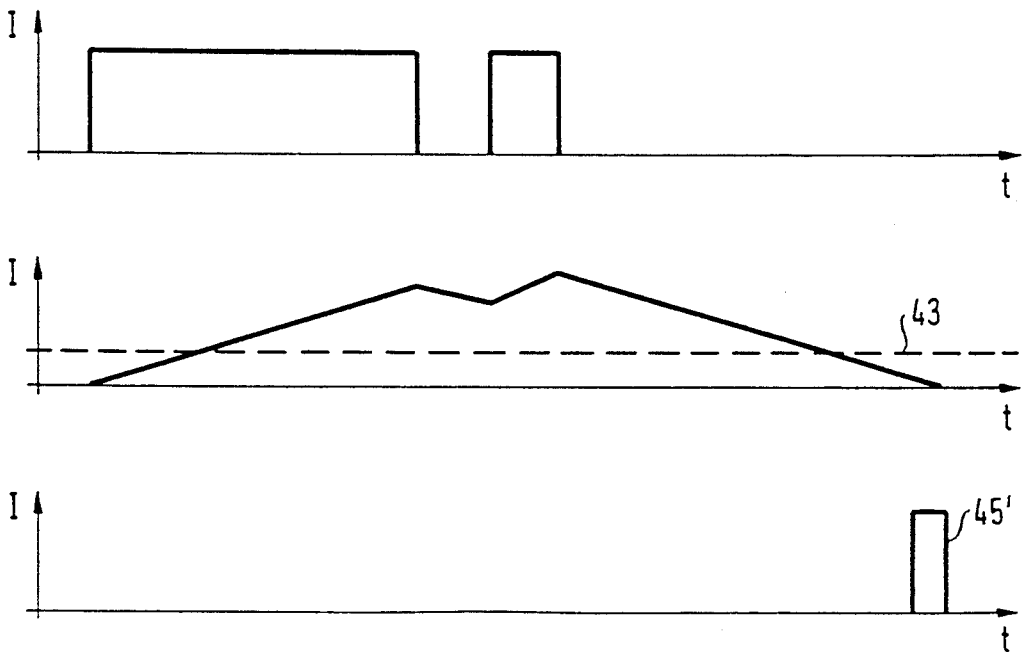

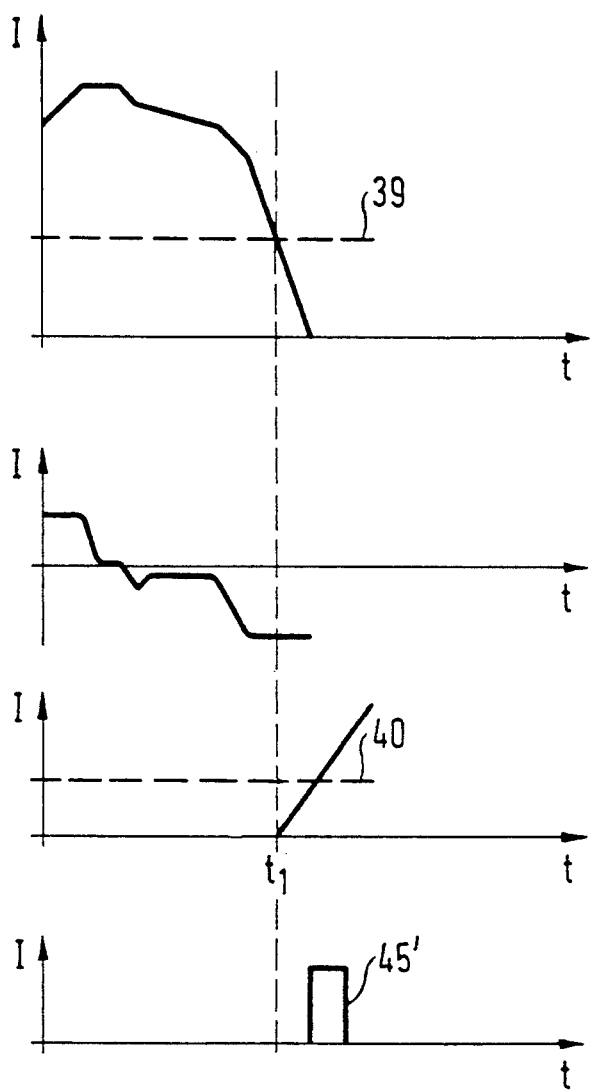

OPTICAL SENSOR FOR DETECTING ARTICLES IN A MONITORED REGION AND METHOD FOR OPERATING THE SAME

BACKGROUND OF THE INVENTION

The invention relates to a method for the operation of an optical sensor arrangement for detecting articles present in a monitored region using a pulsed light transmitter which transmits light pulses with a time spacing one after the other into the monitored region. A light receiver receives light and in the absence of articles to be detected receives substantially no light. When articles are in the monitored region the light receiver receives light and a processing stage connected to the light receiver transmits an article detection signal.

In the optical sensor arrangements with pulsed operation one is concerned in the broadest sense with light barriers, i.e. reflex light barriers, light sensors, distance sensors, visibility measuring devices etc. fall under this term. It is important that an optical sensor arrangement in accordance with the invention receives a light signal when an article to be detected is located in the monitored region and receives no light signal when no article to be detected is present in the monitored region. The invention can in particular be used with advantage when the non-detection of an article guided through the monitored region is unproblematic, i.e. does not for example involve a dangerous state, and in which the presence of an article in the monitored region may in no case be signalled when such an article is not present there.

The invention is primarily used where, for example, articles to be counted such as ampoules or packages pass one after the other through the monitored region and where the presence of an article in the monitored region may under no circumstances be simulated.

Optical sensor arrangements, in particular light barriers for the recognition of articles generally operate in accordance with the pulsed principle in which a light pulse is transmitted periodically for a short duration and the light reflected from the article is received by the light receiver and evaluated in the evaluation circuit. Each transmitted light pulse can for example have a time length of the order of magnitude of 1 to 10 μs. A comparatively long pause, which can correspond to approximately ten to one hundred times the value of the transmitted pulse length, then follows each transmitted light pulse. The use of light pulses has two advantages. On the one hand, an improved signal/noise ratio is achieved in comparison with a continuous transmitter operation with the same power losses. On the other hand, the influence of constant light can be illuminated in simple manner by the insertion of a high pass filter into the received signal processing stage.

Problematic with such pulsed reflex light barriers is however the fact that disturbing signals which change with time, in particular disturbing pulses, can lead to a falsification of the evaluation result when they occur precisely during the sending of a transmitted light pulse and enter via an optical or electromagnetic path into the evaluation circuit. The disturbing signals can be both optical disturbing signals or also electromagnetic disturbances which can be coupled into the electronic part of the reflex light barrier following the optoelectronic conversion in the light receiver.

For this reason one has already attempted to restrict the influence of disturbing signals by filters which follow the light receiver which do not transmit every received signal as a detection signal. These measures have however the disadvantage that only a received light value averaged over a specific time period is evaluated. The effective switching frequency of the actual signal is thereby reduced in undesirable manner.

SUMMARY OF THE INVENTION

The invention is based on the object of providing a method and an arrangement of the initially named kind which with an unchanged output switching frequency, are substantially more resistant to disturbance and which permit an ideal elimination of disturbances, in particular with disturbing signals which occur frequently such as disturbing light.

In order to solve this object the features of present invention are provided. After transmitting a switched off and the output signal of the light receiver is investigated, at least in the end region of the subsequent pause until the next transmitted pulse, as to whether a varying disturbing signal is present. Upon finding a varying disturbing signal the transmission of the next transmitted pulse is shifted timewise by an amount such that on transmitting the next transmitted pulse the disturbing signal has sunk at least with a certain probability below the response threshold of the received signal processing circuit. Alternatively, a disturbance detection stage can be provided which is connected to the light receiver and causes, upon detecting reception of a variable disturbing signal, a subsequent transmitted pulse influencing or trigger stage to trigger the transmission of the next transmitted pulse by the pulse generator activated by the transmitted pulse influencing or trigger stage only after the actual or probable end of the varying disturbing signal. A controlled change-over switch is inserted in the path between the light receiver and the received signal processing stage. The change-over switch is switched so that is connects the light receiver with the received signal processing stage only on the transmission of a transmitted pulse by the pulse transducer. In contrast, in the pause between two transmitted pulses, the change-over switch connects the light receiver at least shortly before the triggering of the next transmitted pulse, preferably during the entire time interval between the sending of two sequential transmitted pulses, to the disturbance stage or to the transmitted pulse influencing or trigger stage.

The basic concept of the invention lies in the fact that the transmitted light pulses are not rigidly periodically transmitted but rather their transmission is made dependent on the occurrence of the disturbing signal scattered in from the outside. For this purpose a received signal is also detected in times at which no transmitted light pulse is transmitted and thereby information is obtained concerning the environment. Through a suitable algorithm an ideal transmission time point can then be determined at which no disturbing signal is instantaneously present, at least with a high probability. The measures of the invention thus extensively prevent a disturbing signal coming from the outside simulating the presence of an article in the monitored region. Only in the most extreme case is it possible, if a varying disturbance should endure for a long period, for the recognition on an article to be totally missed, if the article has been moved out of the monitored region again during this time. The invention is thus in particular applicable with particular advantage where the simulation of the presence in an article may under no circumstances occur, but the occasional non-recognition of an article due to a transmitted light pulse being omitted for too long a time is not disturbing.

In a preferred embodiment, a specific transmitted pulse is only transmitted a predetermined time after the preceding transmitted pulses when no disturbing signal is present shortly before the intended time of transmission. In the presence of such a disturbing signal the transmission of the transmitted pulse is shifted by a predetermined time which preferably corresponds to the fixed time interval present between two transmitted pulses in the disturbance-free case. The transmission of the transmitted pulse after even this time only then takes place when a disturbing signal has not been found shortly before it.

For statistically occurring disturbances it is advantageous to check the presence of a disturbing signal several times between two transmitted pulses.

If, in contrast, a previously known disturbance problem exists which consists in particular in disturbances of periodic character which occur in accordance with a predetermined pattern one can expediently proceed in accordance with another embodiment of the invention. Upon detecting a disturbance with periodic character during the disturbed light receiving periods between the transmitted light pulses, the transmission of the light pulses is effected so that the transmission takes place in the center region of the disturbance-free periods.

A particularly advantageous embodiment investigates the change of the amount and direction of the disturbing signal with respect to two different thresholds, or by means of a differentiation element. The transmission of a transmitted pulse then only taking place when the disturbing signal reduces, with that value of the disturbing signal preferably being extrapolated where the disturbing signal should reduce to zero, and with the transmission of the transmitted pulse first taking place after this value. In a further embodiment the received signal of the light receiver is time-averaged over a long time after a transmitted pulse. The next transmitted pulse is only triggered a when, after a predetermined time, the signal falls beneath a predetermined value. In another embodiment the response threshold for the detection of a disturbing signal lies substantially lower than the response threshold of the received signal processing stage.

With an optical sensor arrangement in accordance with the the clocking of the received signals. Another advantageous embodiment is characterized in that a clock generator, with a frequency of a higher order of magnitude than the normal light pulse frequency, digitizes the received signal. The individual received pulses formed in this way are investigated in the transmitted pulse influencing or trigger stage for the presence or absence of a disturbance. The triggering of a transmitted pulse in the pulse transducer is caused via the transmitted pulse influencing or trigger stage when no disturbance has been found with a predetermined number of preferably sequential received pulses.

The transmitted pulse influencing or trigger stage preferably includes a pulse step down stage connected to the clock generator which first triggers a transmitted pulse only after a plurality of in particular 50 to 100 clock pulses. Upon the occurrence of only one disturbed received pulse the disturbance detection stage prevents the initiation of a transmitted pulse through the pulse step down stage, or through the transmitted pulse influencing or trigger stage, until the predetermined number of undisturbed received pulses has been found.

The clock generator preferably clocks a digital integrator connected to the transmitted pulse influencing or trigger stage representing the disturbance detection stage. The clocked received signal is evaluated in accordance with disturbance or non-disturbance being connected to the digital integrator and with the latter causing the transmitted pulse influencing or trigger stage to initiate a transmitted pulse in the pulse transducer only on the presence of a specific number of disturbance-free received pulses. The digital integrator is reset to zero after the occurrence of only a single disturbed received pulse and with a transmitted pulse only then being triggered when the digital integrator has counted a predetermined number of undisturbed received pulses.

The output signal of a likewise clocked comparator with a fixed threshold to which the received pulses are supplied is connected to the resetting input of the digital integrator.

A more sensitive triggering can take place in accordance with the following embodiments. The output signal of a preferably clocked comparator, to which a two stage threshold signal is supplied from the disturbance detection stage, is applied to the disturbance detection stage and switches between two threshold values when the disturbed signal only falls short of the upper threshold and switches to the lower threshold value when the signal also does not reach the lower threshold. The transmitted pulse is only triggered thereafter, and indeed preferably that much later the longer the disturbing signal adopts a value between the two thresholds.

The following defines preferred practical embodiments of the optical sensor arrangement in accordance with the invention. The transmitted pulse trigger stage has, following an amplifier fed by the light receiver, two comparators with different thresholds and connected in parallel. When the received signal forms short of the upper threshold an internal signal increase is triggered in a subsequent threshold time circuit with an attached comparator and wherein, on also falling short of the lower threshold, an external signal output to the comparator is effected which continuously reduced from the achieved signal increase value. The reduction preferably being linear. A transmitted pulse is triggered only when the external signal of the threshold timing circuit falls short of the threshold of the comparator.

The optical sensor arrangement may also have, following an amplifier which is fed by the light receiver, a first comparator with a first threshold and connected in parallel with a differentiating circuit. The outputs are supplied to the two inputs of a sample and hold circuit which follows a voltage current converter with a subsequent charging element, in particular a capacitor. The charging element, upon achieving a predetermined voltage, causes, via a comparator with a threshold, the transmission in the transmitted pulse influencing or trigger stage of a transmitted pulse trigger signal to the pulse generator.

The optical sensor arrangement may also have a mean value forming stage, for example a low pass filter, acting on the transmitted pulse influencing and trigger stage provided following an amplifier fed by the light receiver. The mean value forming stage triggers a transmitted pulse in the pulse generator via the transmitted pulse influencing or trigger stage when, after a specific time since the last transmitted pulse, the means value falls below a predetermined threshold. In so far as transmitted pulses are absence for longer periods of time as a result of disturbances care should be taken in accordance with the invention that in this case the operating person is made aware of this fact by an alarm signal. Optical sensor arrangement preferably includes a missing pulse detection stage which triggers an alarm device in the absence of a transmitted pulse within a predetermined time interval after the transmission of the last transmitted pulse. Such an alarm signal should be preferably be given in a transmitted pulse, transmitted displaced by more than one period of the normal transmitted pulse sequence. It is also possible to provide a stepped alarm arrangement in such a way that with a comparatively small pulse delay from a half to a whole period and in that a second alarm stage only then responds when a transmitted pulse is transmitted which is delayed by a multiple of the normal pulse sequence period.

DESCRIPTION OF THE PREFERRED EMBODIMENTS

Figure 12:
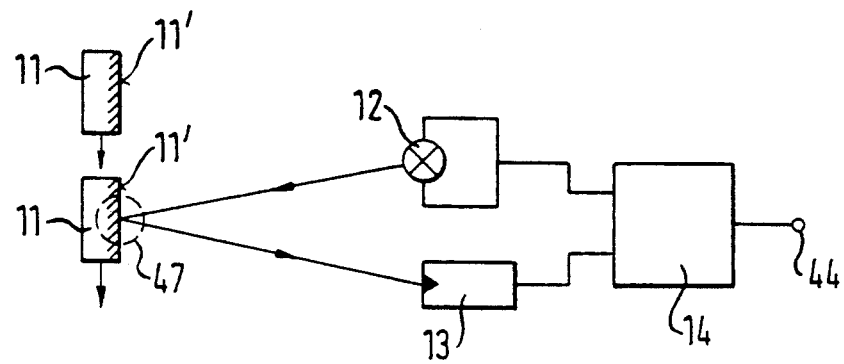

FIG. 12 shows schematically a reflection light barrier with an evaluation circuit 14 having an output 44 and which supplies a pulses light transmitter 12 with voltage pulses so that the latter can transmit light flashes 47 into a monitored region 47. If an article 11 to be detected and having a surface 11' which specularly or scatteringly reflects light is present in the monitored region 47 then a part of the pulsed light will be deflected to a light receiver 13 arranged directly alongside the pulse light transmitter. The corresponding output signal is supplied to the evaluation circuit 14 and investigated to see whether an article 11 is present or not in the monitored region 47. By way of example an electrical L-signal can appear at the output 44 when an article 11 is detected in the monitored region 47. It is for example possible with reflected light barriers to detect articles which pass one after the other through the monitored region 47 and for example to count them. Such reflex light barriers are for example used for article detection in the production of ampoules or flasks.

Figure 13:
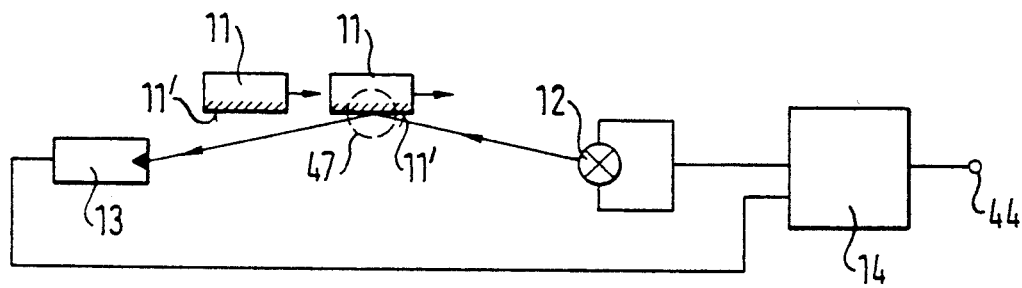

In accordance with FIG. 13 the pulsed light transmitter 12 and the light receiver 13 can also be arranged opposite to one another when the light impinges shallowly onto the reflecting surfaces 11' of the articles 11 in the monitored region 47 and passes from there to the light receiver 13. It is important that in this case also the light receiver 13 is connected to the evaluation circuit 14 which feeds the pulsed light transmitter 12.

Figure 14:
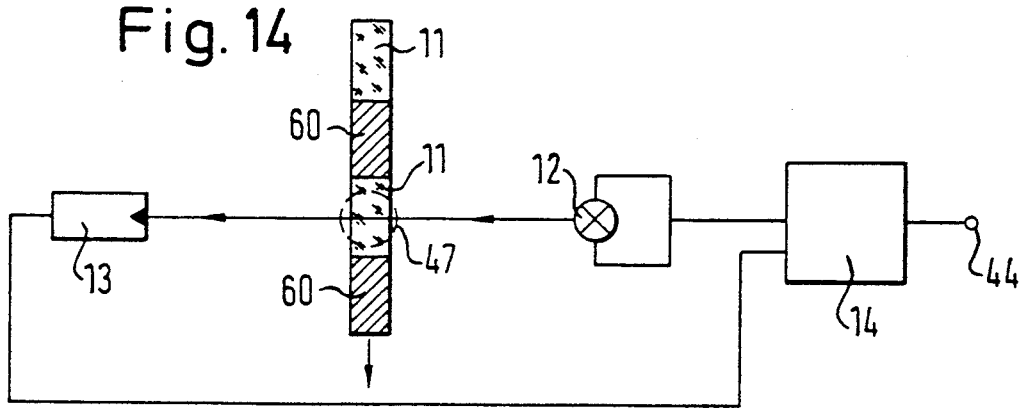

Another possibility of applying the invention is given in the light barrier of FIG. 14 where transparent articles are passed one after the other in the direction of the arrow between the light transmitter 12 and the light receiver 13, with non-transparent regions formed for example by a diaphragm 60 being located between the transparent articles. As the transmitted light pulses can be very shifted substantially as a result of the invention described in detail in the following, depending on the presence or absence of disturbing light amongst other things, it is important in all applications of the invention that the non-recognition of individual articles as a result of light pulses of delayed appearance should not lead to dangerous or non-acceptable circumstances.

Figure 1:
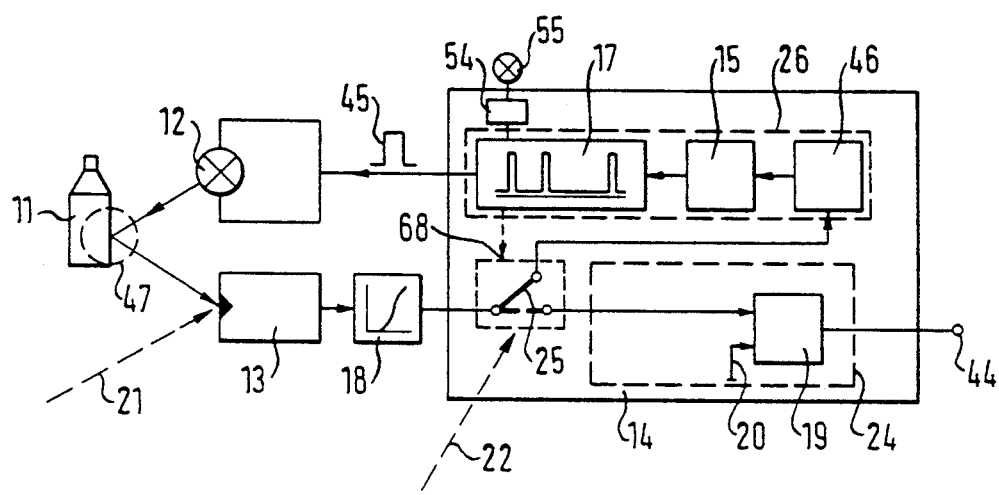
FIG. 1 a circuit diagram of the principle of a reflex light barrier in accordance with the invention, FIG. 2 two intensity time diagrams to illustrate the function of the arrangement of FIG. 1, FIG. 3 a block circuit diagram of a digitally operating reflex light barrier in accordance with the invention, FIG. 4 a block circuit diagram of a further embodiment, the function of which is explained with respect to the three intensity time diagrams of FIG. 5, FIG. 6 a block circuit diagram of a further embodiment, the function of which is explained with respect to the four intensity time diagrams of FIG. 7, FIG. 8 a block circuit diagram of a further embodiment, the function of which is explained with respect to the three intensity time diagrams of FIG. 9, FIG. 10 a block circuit diagram of an embodiment which is somewhat modified relative to FIG. 3, FIG. 11 three intensity time diagrams to illustrate the function of the block circuit of FIG. 10, and FIGS. 12 to 14 a schematic illustration of three different light barrier types with which the invention can be used with advantage.

In accordance with FIG. 1 an optical sensor arrangement in accordance with the invention which is formed as a reflex light barrier has a pulse transmitter 12 which for example transmits transmitted light pulses of for example 5 µs length which, in the absence of disturbing signals, can have a constant time interval of for example 50 times the pulse length.

If a light reflecting article 11 is present in the monitored region 47 of the reflex light barrier then it reflects the incident light of the transmitted light pulses partly to a light receiver 13 which is connected via a high pass filter 18 to an evaluating circuit 14 in which a received signal processing stage 24 is located. The received signal processing stage 24 is connected via a controllable change-over switch 25 with the light receiver 13 and which has a comparator 19 acted on by a threshold signal 20 which determines whether an incoming pulse or an average value of several sequentially incident pulses is larger or smaller than the preferably adjustable threshold signal 20. If the measurement signal which is detected by the comparator 19 is larger than the threshold signal 20 then an article detection signal appears at the output 44.

The control input 68 of the control change-over switch 25 is connected to a pulse generator 17 which causes the pulsed light transmitter 12 to transmit transmitted light pulses. Each time when a transmission pulse 45 is transmitted to the pulsed light transmitter 12 so that the latter transmits a transmitted light pulse, the change-over switch 25 is brought briefly, via a signal supplied from the pulse generator 17 to its control input 68, into the position illustrated in broken lines in FIG. 1 where it connects the light receiver 13 with the received signal processing stage 24, so that the signal received during the duration of a transmitted light pulse from the light receiver 13 can be evaluated in the received signal processing stage 24 in the customary manner.

During the remaining times the change-over switch 25 is in the position illustrated in continuous lines in FIG. 1 in which the light receiver 13 is connected with a disturbance detection stage 46 which acts on a transmitted pulse influencing or trigger stage 15 which is in turn connected to the pulse generator 17. The disturbance detection stage 46, the transmitted pulse influencing or trigger stage 15 and the pulse generator 17 together form the transmission stage 26. The received signal processing stage 24, the change-over switch 25 and the transmission stage 26 together form the evaluation circuit 14.

In so far as no varying optical disturbing signals 21 or electromagnetic disturbing signals 22 act on the receiver part, or on the evaluation circuit 14 of the reflex light barrier of FIG. 1 the transmitted pulse influencing or triggering stage 15 initiates a transmitted pulse 45 at constant time intervals of, for example, 250 μs, which causes a corresponding transmitted light pulse of the pulsed light transmitter 12. For each transmitted pulse 45 the change-over switch 25 switches into the position illustrated in broken lines in FIG. 1 so that during each transmitted pulse an evaluation of the received light can take place in the received signal processing stage 24.

In the pauses between two transmitted light pulses the change-over switch 25 is in the position shown in continuous lines so that in these time periods the output 44 of the received signal processing stage 24 is not influenced by any electrical output signals at the light receiver. Such varying disturbing signals which can be generated by disturbing light 21 or by electromagnetically disturbing relation 22 do however pass into the disturbance detection stage 46 which then causes the transmitted pulse influencing or trigger stage 15 to prevent or delay the triggering of the next transmitted pulse in the pulse generator 17 and indeed for so long until the disturbance detection stage 46 actually detects the termination of the disturbance or the termination of the disturbance is detected as being probable from specific measured values. At the point in time where the disturbance is actually terminated and where its end probably occurs the transmitted pulse influencing or trigger stage 15 is caused by the disturbance detection stage 46 to initiate the next transmitted pulse at the pulse generator 17.

In the simplest case the transmitted pulse influencing or trigger stage 15 can be an oscillator operating at the frequency of the pulse sequence, the pulses of which are suppressed when a disturbing signal is detected by the disturbance detection stage 46 shortly before their transmission.

As, in the latter case, a whole period of the pulse sequence is however lost for the measurement, it is preferred if, on detection on a disturbing signal through the disturbance detection stage 46, the transmitted pulse influencing or trigger stage 15 is caused to only delay the triggering of the next transmitted pulse which is actually due only until the disturbing signal has at least largely died away.

Figure 2:
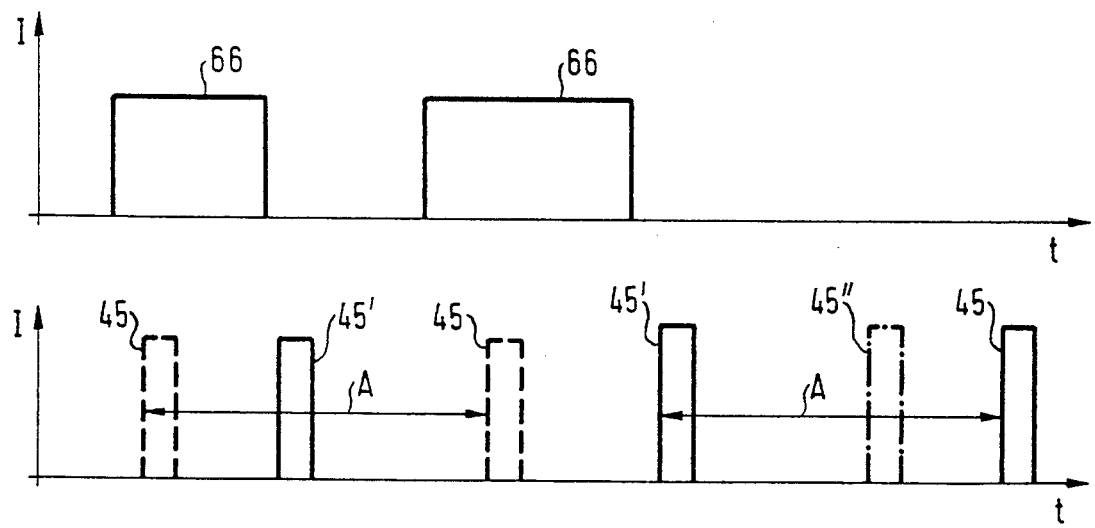

This is diagrammatically illustrated in FIG. 2. In the lower diagram the transmitted pulses which are normally initiated by the transmitted pulse influencing or trigger stage 15 at the pulse generator 17 are illustrated in broken lines at 45.

In the upper diagram two disturbing pulses 66 are reproduced which can be coupled either optically (21 in FIG. 1) or electromagnetically (22 in FIG. 1) into the reception precisely during the times at which the transmitted pulses 45 which are used for the measurement should actually occur.

As a result of the method of the invention the transmitted pulses are however now in each case displaced until the disturbing pulse 66 disappears so that they actually occur at the positions 45' in FIG. 2 where no disturbing signals are any longer present. In this manner a disturbance-free reception is ensured during the times of the transmitted pulses.

The second displaced transmitted pulse 45' in the lower diagram of FIG. 2 is again followed by a normal transmitted pulse 45 in the given normal interval A. Transmitted pulses 45 then subsequently occur again at the predetermined constant time intervals so long as no further disturbing signal is received in a pulse gap.

In a simplified solution the transmitted pulses 45 are simply suppressed while the next pulse 45" provided in the given interval is again released by the transmitted pulse influencing or trigger stage 15.

Thus, in any event, a comparatively long pause is provided between the transmitted pulses. Only after the expiry of the long pauses are the test light receptions preferably carried out. A continuous signal evaluation is also actually possible, however for thermal reasons of the transmitter stage 26 at least the long pause must always be given for a new light pulse.

In accordance with FIG. 1 a pulse drop out detection stage 54 is also connected to the pulse generator 17 which is in turn connected with an alarm apparatus 55 of an optical or acoustic nature. In this way an alarm signal can be transmitted when a transmitted pulse 45 which is actually due has still not occurred after a specific interval before benefits become available. The operating person is hereby made aware of the delayed or possibly totally no longer existing operability of the sensor arrangement.

Figure 3:
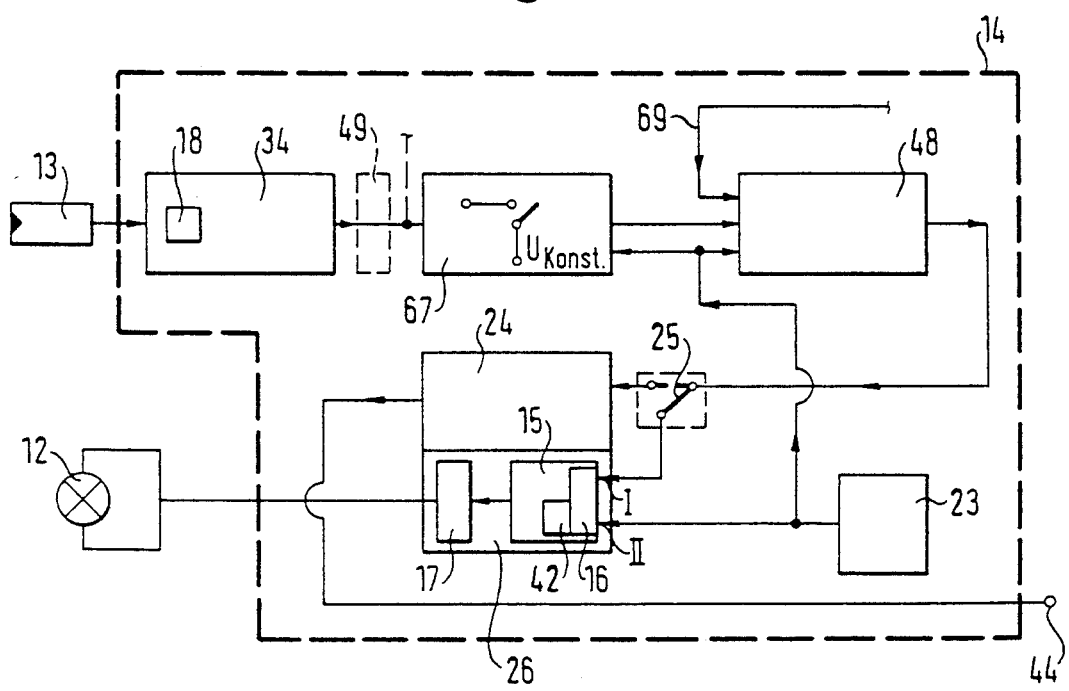

FIG. 3 shows a digitally operating embodiment in which the same reference numerals designate the same components as in FIG. 1. The output signal of the light receiver 13 is applied via an amplifier 34 containing a high pass filter 18 and eventually an integrator 49 to a clamping switch 67 which is connected to a comparator 48 with a reference threshold 69.

The output signal of the comparator 48 is applied via the change-over switch 25 in parallel to the received signal processing stage 24 and to the transmitter stage 26 which, as in FIG. 1, contains the transmitted pulse influencing or trigger stage 15 and the pulse generator 17.

A digital integrator 16 for example in the form of a counter, is provided in the transmitted pulse influencing or trigger stage 15 as a disturbance detection stage. On the one hand, the output signal of the comparator 48 is supplied to the digital integrator 16 and, on the other hand, the clock signal of a clock generator 23 is supplied to the digital integrator, the clock generator 23 also clocking (timing) the switch 67 and the comparator 48. The frequency of the clock generator 23 amounts to many times, for example 50 to 100 times the transmitted pulse frequency in the case of non-presence of disturbing signals.

In so far as a disturbing signal occurs between the transmitted pulses the latter is applied, as a result of the periodic closing of the clamping switch 67 brought about by the clock generator 23, to the input of the comparator 48 which in each case transmits a pulse output signal applied to the input I of the digital integrator 16 when the disturbance exceeds the reference threshold 69.

As long as no disturbance is present the counter or digital integrator 16 counts the beats of the clock generator 23 because then the absence of a resetting signal at the input II of the digital integrator 16 signalises freedom from disturbance. On the occurrence of the disturbing signal at the output of the comparator 48 the counter is reset. A transmitted pulse is first triggered through the transmitted pulse influencing or trigger stage 15 when the digital integrator 16 has achieved a predetermined positive and in particular presettable count +N. This states namely that a defined number of test light receptions has occurred free of disturbance.

Figure 4:
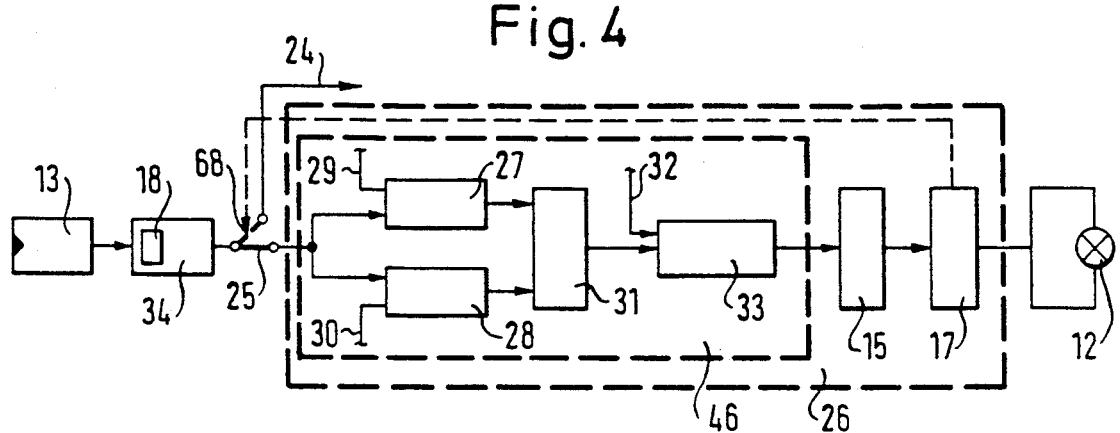

A substantially more differentiated evaluation is possible with the circuit of the transmitted pulse influencing or trigger stage 15 of FIG. 4. There the output signal of the light receiver 13 is applied via an amplifier 34 in parallel to two comparators 27, 28 which, in accordance with the upper diagram in FIG. 5, have two thresholds 29, 30 of different heights.

The outputs of the two comparators 27, 28 are applied to the two inputs of a threshold time element 31 which is nudged into action on being exposed to an output signal of the comparator 28 having the higher threshold 30 and which transmits an output signal which rises in accordance with the center diagram in FIG. 5 (time points $t_1$ and $t_2$). If the disturbing signal subsequently exceeds again the threshold (time point $t_4$) then the threshold time circuit 31 is again reset internally.

If however the comparator 27 responds as a result of the signal falling short of the threshold 29 then the already integrated time value ($t_3$) is used in order to find the point at which the light transmission should take place, i.e. at which the disturbance would reduce to zero if the assumed linear drop off continues. A comparator 33 with the threshold 32 and connected to the threshold time circuit 31 detects when the signal falls below the threshold 32, which can be zero. In this way a transmitted pulse trigger signal is transmitted to the pulse generator 17 via the transmitted pulse influencing or trigger stage 15 so that the pulse generator 17 transmits the transmitted pulse signal 45' reproduced in the lower diagram of FIG. 5.

A disturbing signal is reproduced in the upper diagram of FIG. 5 which had for the first time already fallen below the upper threshold at an earlier time $t_1$, whereby the threshold time circuit 31 is also caused to increase an internal integration voltage 51. As the disturbing signal however subsequently exceeds the threshold 30 again the threshold time circuit 31 is again reset internally to its output value without leading to the triggering of the comparator 33.

Only when the passage of the signal through the upper threshold 30 from above to below at the time $t_2$ is followed by a time $t_3$ at which the signal also passes through the lower threshold 29 at the time $t_3$ is the threshold switching member 31 internally so switched over that a linearly reducing output voltage 50 (FIG. 5) appears at its output.

The increase of the gradient which reproduces the output potential 50 must be sufficiently small that the signal only falls short of the lower threshold 32 when the disturbing signal has already become zero at a time t. The duration of the presence of the disturbing signal between the thresholds 29, 30 thus influences in advantageous manner the triggering of the transmitted pulse.

Figure 6:
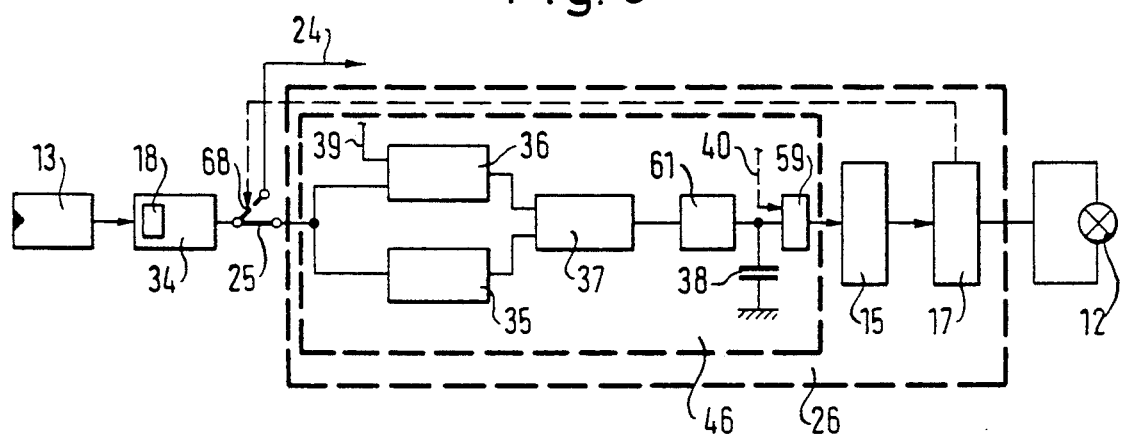

The embodiment of FIGS. 6 and 7 operates following the amplifier 34 with a comparator 36 which has a threshold 39 and which is connected in parallel with a differentiating circuit 35. The outputs of the differentiating circuit 35 and of the comparator 36 are connected to the two inputs of a sample and hold circuit 37 which is followed by a voltage current converter 61 with a subsequent capacitor 38 which is rechargeable with a predetermined time constant in accordance with the output signal of the circuit 37. The capacitor 38 is connected to the transmitted pulse influencing or trigger stage 15.

The capacitor 38 is connected to a further comparator 59 with the threshold 40 (see also FIG. 7) which then transmits a corresponding signal to the transmitted pulse influencing or trigger stage 15 when the voltage of the capacitor 38 exceeds the reference value 40 with the transmitted pulse influencing or trigger stage 15 then accordingly triggering the transmitted pulse.

In accordance with FIG. 7, uppermost diagram, the disturbing signal received at the light receiver 13 has a tendency to drop away steeply. The differentiated signal at the output of the differentiating circuit 35 is reproduced in the second diagram from the top in FIG. 7. If the comparator 36 detects that the disturbing signal has fallen below the threshold 39, then a signal is transmitted to the sample and hold circuit 37 which, in accordance with the second diagram from the top in FIG. 7 causes the output signal of the differentiating circuit 35 to be held in the sample and hold circuit 37. At the same time the start of the charging of the capacitor 38 is initiated by the circuit 37 which is illustrated in the third diagram from the top in FIG. 7.

As soon as the voltage at the capacitor 38 in accordance with the third diagram from the top in FIG. 7 has exceeded the threshold 40 the transmitted pulse influencing or triggering stage 15 is caused by the comparator which detects this to transmit a trigger signal which in turn causes the pulse generator 17 to send a transmission pulse to the pulsed light transmitter 12. The transmitted pulse 45' is schematically reproduced in the lowermost diagram of FIG. 7.

Figure 8:
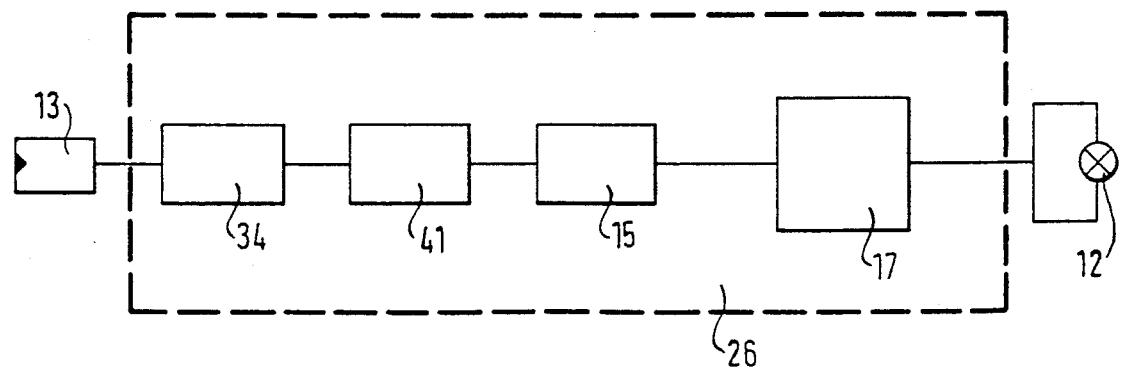

FIG. 8 shows a further possibility for eliminating disturbing signals by suitable shifting of the transmitted pulse 45'.

Here the output signal of the amplifier 34, which in this case can contain a high pass filter, is applied in rectified form to a low pass filter 41 which represents a mean value forming stage which operates in accordance with the middle diagram of FIG. 9 in so far as the disturbing signals illustrated schematically in the uppermost diagram of FIG. 9 are present. An output signal which exceeds the threshold 43 is present at the output of the low pass filter 41 which has only died away sufficiently that it falls below the threshold 43 again, a certain time after termination of the last disturbing signal. This is determined by the transmitted pulse influencing or trigger stage 15 which then triggers the transmitted pulse 45' (lowermost diagram in FIG. 9) in the pulse generator 17.

Figure 10:
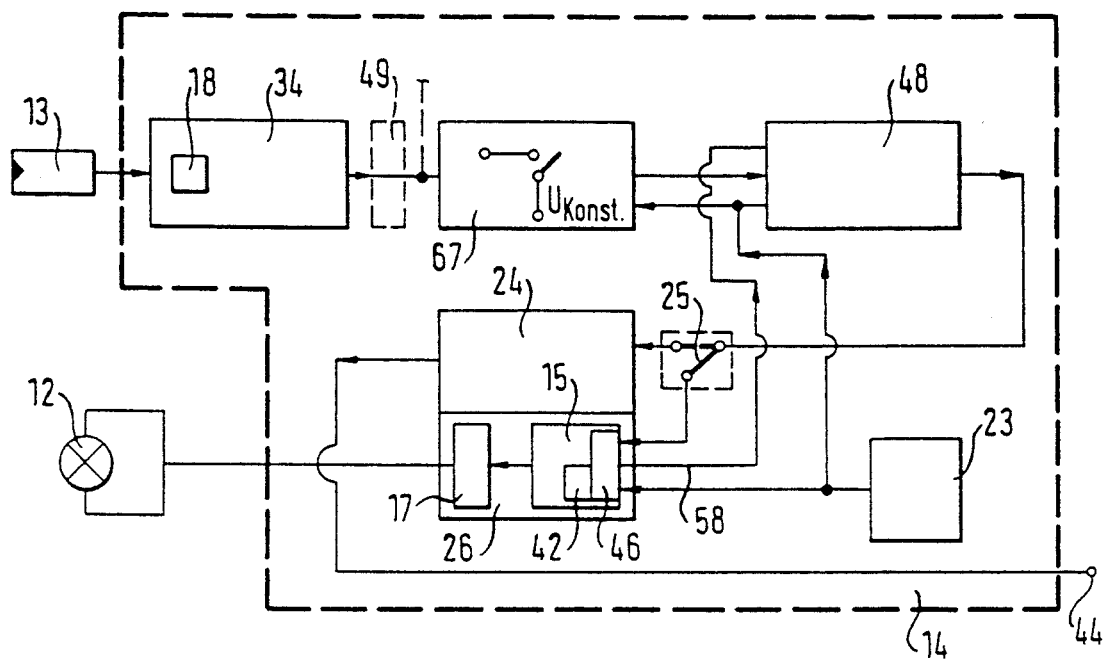

FIG. 10 shows a modification of the circuit of FIG. 3 which resides in that a reference line 58 having a two stage threshold signal is connected to the reference input of the comparator 48 in place of a fixed threshold 49, with the reference line being tapped off from the disturbance detection stage 46 which is arranged before the transmitted pulse influencing or trigger stage 15 and which is acted on by the output of the comparator 48 and also by the clock generator 23.

Figure 11:
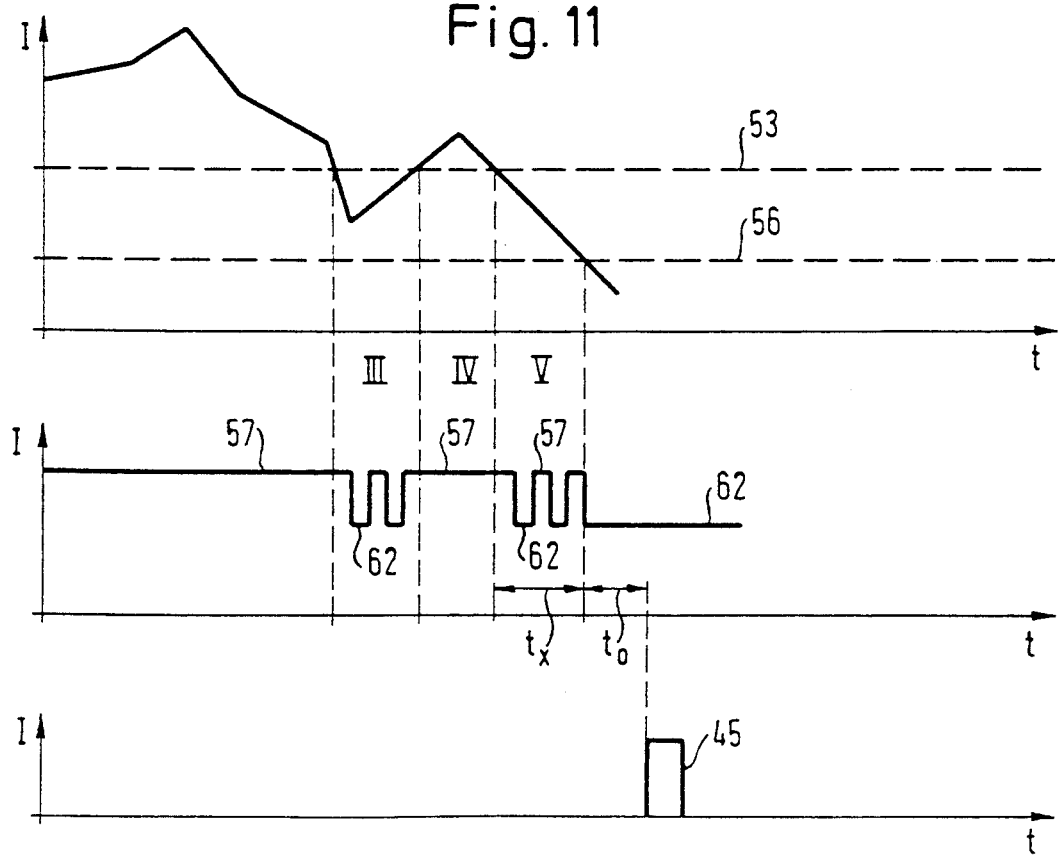

In accordance with the uppermost diagram in FIG. 11 the disturbance detection stage 46 is able to distinguish between an upper threshold 53 and a lower threshold 56. If the disturbing signal reproduced in the uppermost diagram of FIG. 11 is first above the upper threshold 53 then a disturbing signal appears at the output of the comparator 48 which initially holds the disturbance detection stage 46 at an upper threshold value 57 (see the second diagram from the top in FIG.

11). If the disturbing signal falls below the upper threshold 53 then the disturbance detection stage 46 first switches to a lower threshold value 62. Accordingly the reference threshold of the comparator 48 is reduced via the line 58. If now—as is assumed in FIG. 11 in the region III—the disturbance lies between the thresholds 53 and 56 then this is recognised by the disturbance detection stage 56 and it switches after a short period of time to the upper threshold again etc. until in the region IV (FIG. 11) the disturbance again exceeds the upper threshold 53, whereupon the disturbance detection stage 46 is again firmly set to the upper threshold value 57.

If the disturbing signal then again falls below the upper threshold 53 in the region V then the to and fro switching of the disturbance detection stage 46 between the threshold values 57 and 62 is first repeated until finally the disturbing signal falls below the lower threshold 56, whereupon the disturbance detection stage 46 remains at the lower threshold value 62 and after a specific time initiates the transmitted pulse 45 indicated in the lower diagram of FIG. 11.

In accordance with the invention the time $t_0$ between the time at which the signal falls below the lower threshold 56 and the triggering of the transmitted pulse 45 can be made dependent of the length of the time $t_x$ during which the disturbing signal is present between the thresholds 53 and 56. The longer this time interval $t_x$ is the longer should be the time $t_0$ after which the transmitted pulse 45 is triggered. That is to say, that with rapidly decaying disturbances the transmitted pulse 45 is initiated a relatively short time after the signal falls below the lower threshold 56, whereas with long enduring disturbances between the thresholds 53 and 56 the time until the transmitted pulse 45 is initiated, is correspondingly lengthened.

The circuit of FIG. 10 thus discloses a further possibility as to how the speed of reduction of the disturbing signal can be taken into account with more or less delayed initiation of the transmitted pulse 45.

We claim:

1. Method for the operation of an optical sensor arrangement for the detection of articles present in a monitored region with a pulsed light transmitter which transmits light pulses with a time spacing one after the other into the monitored region and with a light receiver which in the absence of articles to be detected receives substantially no light from the light receiver, but which on the presence of an article to be detected in the monitored region receives so much light from the light transmitter by reflection or transmission that a received signal processing stage connected to the light receiver transmits an article detection signal, characterised in that after transmitting a transmitted light pulse the received signal processing stage (24) is switched off and the output signal of the light receiver (13) is investigated, at least in the end region of the subsequent pause until the next transmitted pulse (45), as to whether a varying disturbing signal is present; and in that on finding a varying disturbing signal the transmission of the next transmitted pulse is shifted timewise by an amount such that on transmitting the next transmitted pulse the disturbing signal has sunk at least with a certain probability below the response threshold of the received signal processing circuit (24).

2. Method in accordance with claim 1, characterised in that the result of a transmitted light pulse is temporarily stored and an article detection signals is only then triggered when an article was recognised and at the same time no variable disturbing signal was determined not only prior to but also after transmission of the transmitted light pulse.

3. Method in accordance with claim 2, characterised in that the durations of the time intervals investigated for the presence of a variable disturbing signal prior to and after transmission of the transmitted light pulse are of the same size.

4. Method in accordance with claim 1, characterised in that a specific transmitted pulse is only then transmitted a predetermined time after the preceding transmitted pulses when no disturbing signal is present shortly before the intended time of transmission; and in that in the presence of such a disturbing signal the transmission of the transmitted pulse is shifted by a predetermined time which preferably corresponds to the fixed time interval present between two transmitted pulses in the disturbance-free case; and in that the transmission of the transmitted pulse after even this time only then takes place when a disturbing signal has not been found shortly before it, etc.

5. Method in accordance with claim 1, characterised in that a transmitted pulse is first transmitted when no disturbing signals were found in several time intervals which respectively correspond to the normal time interval between two transmitted pulses shortly before the expiry of these times.

6. Method in accordance with claim 1, characterised in that on detecting a disturbance with periodic character during the disturbed light receiving periods between the transmitted light pulses the transmission of the light pulses is effected such that it takes place in the center region of the disturbance-free periods.

7. Method in accordance with claim 1, characterised in that the change of the disturbing signal is determined with respect to its amount and direction in that the changing disturbing signal is preferably investigated with respect to two different thresholds (29, 30; 53; 56), or by means of a differentiation element (35), with the transmission of a transmitted pulse only then taking place when the disturbing signal reduces, with that value of the disturbing signal preferably being extrapolated where the disturbing signal should reduce to zero, and with the transmission of the transmitted pulse first taking place after this value.

8. Method in accordance with claim 1, characterised in that the received signal of the light receiver is time-averaged over a long time after a transmitted pulse and in that the next transmitted pulse is only triggered when after a predetermined time since the last transmitted pulse this signal falls beneath a predetermined value.

9. Method in accordance with claim 1, characterised in that the response threshold for the detection of a disturbing signal lies substantially lower than the response threshold of the received signal processing stage (24).

10. Optical sensor arrangement for detecting articles present in a monitored region comprising a pulsed light transmitter which transmits light pulses having a time spacing one after the other into the monitored region, and a light receiver which is so arranged relative to the light transmitter and the monitored region that in the absence of articles to be detected in the monitored region it receives at least substantially no light from the light receiver, but on the presence of an article to be detected in the monitored region receives so much light from the light transmitter through reflection or transmission that a received signal processing stage connected to the light receiver transmits an article detection signal, characterised in that a disturbance detection stage (16; 46) is also connected or connectable to the light receiver (13) and causes, on detecting reception of a variable disturbing signal, a subsequent transmitted pulse influencing or trigger stage (15) to trigger the transmission of the next transmitted pulse by the pulse generator (17) activated by the transmitted pulse influencing or trigger stage (15) only after the actual or probable end of the varying disturbing signal, and in that a controlled change-over switch (25) is inserted in the path between the light receiver (13) and the received signal processing stage (24) and is so switched, that it connects the light receiver (13) with the received signal processing stage (24) only on the transmission of a transmitted pulse by the pulse transducer (17) but in contrast, in the pause between two transmitted pulses connects the light receiver (13) at least shortly before the triggering of the next transmitted pulse, preferably however during the entire time interval between the sending of two sequential transmitted pulses, to the disturbance detection stage (16; 46) or to the transmitted pulse influencing or trigger stage (15).

11. Optical sensor arrangement in accordance with claim 10, characterised in that a clock generator (23) with a frequency of a higher order of magnitude than the normal light pulse frequency digitises the received signal; in that the individual received pulses formed in this way are investigated in the transmitted pulse influencing or trigger stage (15) for the presence or absence of a disturbance; and in that the triggering of a transmitted pulse in the pulse transducer (17) is caused via the transmitted pulse influencing or trigger stage (15) when no disturbance has been found with a predetermined number of preferably sequential received pulses.

12. Optical sensor arrangement in accordance with claim 11, characterised in that the transmitted pulse influencing or trigger stage includes a pulse step down stage (42) connected to the clock generator (23) which first triggers a transmitted pulse only after a plurality of in particular 50 to 100 clock pulses; and in that on the occurrence of only one disturbed received pulse the disturbance detection stage (16, 46) prevents the initiation of a transmitted pulse through the pulse step down stage (42), or through the transmitted pulse influencing or trigger stage (15), until the predetermined number of undisturbed received pulses has been found.

13. Optical sensor arrangement in accordance with claim 11, characterised in that the clock generator (23) clocks a digital integrator (16) connected to the transmitted pulse influencing or trigger stage (15) representing the disturbance detection stage, with the clocked received signal which is evaluated in accordance with disturbance or non-disturbance being connected to the digital integrator and with the latter causing the transmitted pulse influencing or trigger stage (15) to initiate a transmitted pulse in the pulse transducer (17) only on the presence of a specific number of disturbance-free received pulses, with the digital integrator (16) in particular being reset to zero after the occurrence of only a single disturbed received pulse and with a transmitted pulse only then being triggered when the digital integrator (16) has counted a predetermined number (N) of undisturbed received pulses.

14. Optical sensor arrangement in accordance with claim 13, characterised in that the output signal of a likewise clocked comparator (48) with a fixed threshold (69) to which the received pulses are supplied is connected to the resetting input (I) of the digital integrator (16).

15. Optical sensor arrangement in accordance with claim 10, characterised in that the output signal of a preferably clocked comparator (48), to which a two stage threshold signal (58) is supplied from the disturbance detection stage (46), is applied to the disturbance detection stage (46) and switches to and fro between two threshold values (57, 62) when the disturbed signal only falls short of the upper threshold (53) and switches to the lower threshold value (62) when the signal also does not reach the lower threshold (56); and in that the transmitted pulse (45) is only triggered thereafter, and indeed preferably that much later the longer the disturbing signal adopts a value between the two thresholds (53, 56).

16. Optical sensor arrangement in accordance with claim 10, characterised in that the transmitted pulse trigger stage (15) has, following an amplifier (34) fed by the light receiver (13), two comparators (27, 28) with different thresholds (29, 30) and connected in parallel, wherein, when the received signal forms short of the upper threshold (30) an internal signal increase is triggered in a subsequent threshold time circuit (31) with an attached comparator (33) and wherein, on also falling short of the lower threshold (29), an external signal output to the comparator (33) is effected which continuously reduces from the achieved signal increase value, and in particular decreases linearly, and in that a transmitted pulse is triggered only when the external signal of the threshold timing circuit (31) falls short of the threshold (32) of the comparator (33).

17. Optical sensor arrangement in accordance with claim 10, characterised in that it has, following an amplifier (34) which is fed by the light receiver (13), a first comparator (36) with a first threshold (39) and connected in parallel with a differentiating circuit (35), the outputs of which are supplied to the two inputs of a sample and hold circuit (37) which follows a voltage current converter (61) with a subsequent charging element, in particular a capacitor (38), which, on achieving a predetermined voltage, causes, via a comparator (59) with a threshold (40), the transmission in the transmitted pulse influencing or trigger stage (15) of a transmitted pulse trigger signal to the pulse generator (17).

18. Optical sensor arrangement in accordance with claim 10, characterised in that the transmitted pulse influencing and trigger stage (15) is acted on by a mean value forming stage (41), for example in the form of a low pass filter, provided following an amplifier (34) fed by the light receiver (13), with the mean value forming stage triggering a transmitted pulse in the pulse generator (17) via the transmitted pulse influencing or trigger stage (15) when, after a specific time since the last transmitted pulse, the mean value falls below a predetermined threshold (43).

19. Optical sensor arrangement in accordance with claim 10, characterised in that a missing pulse detection stage (54) is provided which triggers an alarm device (55) in the absence of a transmitted pulse within a predetermined time interval after the transmission of the last transmitted pulse.

* * * * *